United States Patent [19]

Sawada et al.

[11] Patent Number: 5,650,642
[45] Date of Patent: Jul. 22, 1997

[54] FIELD EFFECT SEMICONDUCTOR DEVICE

[75] Inventors: Minoru Sawada, Hirakata; Shigeharu Matsushita, Katano; Satoshi Terada, Hirakata; Emi Fujii, Nara-ken; Yasoo Harada, Hirakata, all of Japan

[73] Assignee: Sanyo Electric Co., Ltd., Osaka-fu, Japan

[21] Appl. No.: 400,651

[22] Filed: Mar. 8, 1995

[30] Foreign Application Priority Data

Mar. 8, 1994 [JP] Japan .................................. 6-037021

[51] Int. Cl.$^6$ .................................................. H01L 29/161
[52] U.S. Cl. ..................................... 257/192; 257/194
[58] Field of Search .................................. 257/20, 192, 194

[56] References Cited

U.S. PATENT DOCUMENTS

| Re. 33,584 | 5/1991 | Mimura ................................. 257/194 |
| 4,163,237 | 7/1979 | Dingle et al. ........................... 257/20 |
| 4,558,337 | 12/1985 | Saunier et al. ......................... 257/194 |

OTHER PUBLICATIONS

Technical Report of IEICE. ED 93–175, MW 93–132, ICD 93–190 (1994–01), 21 Jan. 1994.
IEEE Electron Device Letters, vol. 14, No. 7, Jul. 1993.
Int. Electron Devices Meeting Tech. Dig. (IEEE, New York, 1986) pp. 759–762, 7 Dec. 1986.

*Primary Examiner*—Donald Monin
*Attorney, Agent, or Firm*—Darby & Darby

[57] ABSTRACT

A field effect semiconductor device comprises a first channel layer composed of an undoped semiconductor in which electrons mainly drift in low-noise operation and a second channel layer composed of a semiconductor of one conductivity type in which electrons mainly drift in high-power operation, a third channel layer being provided in the second channel layer or on the second channel layer on the opposite side of the first channel layer. The third channel layer is constituted by at least one semiconductor layer of the one conductivity type or undoped having a greater electron affinity than that of the second channel layer and having a smaller forbidden bandgap than that of the second channel layer. In another field effect semiconductor device, an undoped impurity diffusion preventing layer having an electron affinity approximately equal to that of the second channel layer is provided between the first channel layer and the second channel layer.

23 Claims, 4 Drawing Sheets

FIELD EFFECT SEMICONDUCTOR DEVICE

CROSS-REFERENCE TO RELATED APPLICATION

This application is related to copending application Ser. No. 08/109,354, filed Aug. 20, 1993, commonly assigned with present invention.

BACKGROUND OF THE INVENTION

1. Field of the Invention

The present invention relates generally to field effect semiconductor devices, and more particularly, to a field effect semiconductor device having both low-noise operating characteristics and high-power operating characteristics.

2. Description of the Background Art

In recent years, as the demand for microwave communication systems such as satellite broadcasting and microwave communication have arisen, miniaturization of communication devices has been required. In the communication device in the microwave communication system, high-power operating characteristics are required at the time of transmission, while low-noise operating characteristics are required at the time of receiving.

As a conventional device used for such a communication device, a high electron mobility transistor (HEMT) which is one of field effect transistors (FETs) has been known. In the HEMT, however, good low-noise characteristics are obtained, while good high-power characteristics are not obtained.

As another conventional device, an FET having a highly doped channel has been known. In this device, superior high-power characteristics are obtained, while good low-noise characteristics are not obtained.

Therefore, a field effect semiconductor device having both low-noise operating characteristics and high-power operating characteristics has been recently developed, as described in TECHNICAL REPORT OF IEICE, ED93–175, NW93–132, ICD93–190 (1994–01), pp. 47–54 and IEEE ELECTRON DEVICE LETTERS, VOL. 14, NO. 7, pp. 354–356, July 1993, for example. The field effect semiconductor device is referred to as a two-mode channel FET (TMT) device.

FIG. 5 is a schematic cross sectional view showing the structure of a conventional TMT device. In FIG. 5, an undoped GaAs buffer layer 102, an undoped InGaAs channel layer (hereinafter referred to as a first low-noise drift layer) 103, and an undoped graded $In_xGa_{1-x}As$ channel layer (hereinafter referred to as a second low-noise drift layer) 104 are formed in that order on a GaAs substrate 101. The In composition ratio x in the second low-noise drift layer 104 is decreased in a graded manner from 0.2 to 0 upward from the side of the substrate 101.

An n-GaAs electron-supplying and channel layer (hereinafter referred to as a high-power drift layer) 105 and an n-AlGaAs barrier layer 106 having an Al composition ratio of 0.22 are formed in that order on the second low-noise drift layer 104. n-GaAs cap layers 107a and 107b are formed spaced apart from each other on the barrier layer 106. A gate electrode 108 in Schottky contact with the barrier layer 106 is formed on the barrier layer 106 exposed between the cap layers 107a and 107b and a source electrode 109 and a drain electrode 110 in ohmic contact with the cap layers 107a and 107b are respectively formed on the cap layers 107a and 107b.

In the TMT device, at a deep applied gate voltage (a gate-source voltage) $V_{gs}$, the low-noise drift layers 103 and 104 become channels in an electron drift mode. In this case, electrons are well confined in quantum wells of the low-noise drift layers 103 and 104, whereby the electrons are hardly affected by impurities in the high-power drift layer 105 doped at a high density, thereby to obtain super-low-noise characteristics. On the other hand, at a shallow applied gate voltage $V_{gs}$, the high-power drift layer 105 doped at a high density mainly becomes a channel in an electron drift mode, thereby to obtain high-power characteristics.

Furthermore, in the TMT device, the applied gate voltage $V_{gs}$ can be also so selected between the above described voltages that the low-noise drift layers 103 and 104 and the high-power drift layer 105 mainly become channels in an electron drift mode. In the case of a TMT device having an n-type high-power drift layer (an n-type channel), a shallow applied gate voltage $V_{gs}$ means such an applied gate voltage that a depletion region shrinks, while a deep applied gate voltage $V_{gs}$ means such an applied gate voltage $V_{gs}$ that a depletion region extends.

In order to further improve high frequency characteristics in the TMT device, the gate length L shown in FIG. 5 must be decreased to decrease gate capacitance. If the gate length L is set to not more than approximately 0.15 μm, electrons drifting in the high-power drift layer 105 are controlled by the applied gate voltage $V_{gs}$ only in a narrow gate portion in a case where the applied gate voltage $V_{gs}$ is shallow (in the range in which high-power characteristics are obtained). On the other hand, larger overshoot of electron velocity occurs in the narrow gate portion in a case where the applied gate voltage $V_{gs}$ is deep (in the range in which low-noise characteristics are obtained). Therefore, the transconductance (gm) in the range in which the applied gate voltage $V_{gs}$ is shallow is lower than that in the range in which the applied gate voltage $V_{gs}$ is deep, whereby transconductance (gm)— applied gate voltage ($V_{gs}$) characteristics are not flat (plateau shaped). The transconductance (gm) is the ratio of the change in a drain current to the change in the applied gate voltage, which represents the amplification degree of a signal.

If the gm—$V_{gs}$ characteristics are not plateau shaped, an output signal is made nonlinear with respect to an input signal in high-power operation of the TMT device, that is, an output signal is distorted. Therefore, if the TMT device is used for a digital handy phone, for example, noises are increased at the time of signal transmission.

In the conventional TMT device shown in FIG. 5, the n-AlGaAs barrier layer 106 having a high Schottky barrier height must be exposed between the cap layers 107a and 107b by the etching process so as to provide the gate electrode 108. The etching process damages the exposed n-AlGaAs barrier layer 106, thereby to make it difficult to produce the TMT device at low cost and with high yield.

If high conductive regions are provided by the ion implantation process and the anneal process beneath the source electrode 109 and the drain electrode 110 instead of providing the cap layers 107a and 107b for ohmic contact of the source electrode 109 and the drain electrode 110, the TMT device can be fabricated at low cost and with high yield.

In such a structure, however, it is considered that the impurities in the high-power drift layer 105 are diffused into the second low-noise drift layer 104 in the anneal process. Therefore, pinch-off characteristics of a drain current in the vicinity of the threshold of the drain current in drain current ($I_{ds}$)—applied gate voltage ($V_{gs}$) characteristics is degraded. As a result, if the TMT device is used as a low-noise device, the transconductance (gm) is greatly decreased, thereby to degrade noise characteristics.

SUMMARY OF THE INVENTION

An object of the present invention is to provide a TMT device in which the distortion of an output signal in high-power operation is reduced.

Another object of the present invention is to provide a TMT device in which high frequency characteristics are improved without distorting an output signal in high-power operation.

Still another object of the present invention is to provide a TMT device capable of forming electrodes at low cost and with high yield while maintaining good noise characteristics.

A further object of the present invention is to provide a TMT device in which high conductive regions for ohmic electrodes are provided while maintaining good pinch-off characteristics of a drain current in drain current ($I_{ds}$)—applied gate voltage ($V_{gs}$) characteristics.

A field effect semiconductor device according to the present invention comprises an undoped first semiconductor layer, an undoped second semiconductor layer formed on the first semiconductor layer, a third semiconductor layer of one conductivity type formed on the second semiconductor layer, and a fourth semiconductor layer of the one conductivity type or undoped formed on the third semiconductor layer, the second semiconductor layer having an electron affinity which is greater than that of the first semiconductor layer on its surface on the side of the first semiconductor layer and is equal to or greater than that of the third semiconductor layer on its surface on the side of the third semiconductor layer, and the fourth semiconductor layer having an electron affinity which is equal to or smaller than that of the third semiconductor layer on its surface on the side of the third semiconductor layer, and further comprises a fifth semiconductor layer of the one conductivity type or undoped formed in the third semiconductor layer or between the third semiconductor layer and the fourth semiconductor layer, having a greater electron affinity than that of the third semiconductor layer, and having a smaller forbidden bandgap (energy gap) than that of the third semiconductor layer.

The electron affinity corresponds to the energy difference from a lower end of a conduction band to a vacuum level.

The first semiconductor layer is a buffer layer, the second semiconductor layer is a first channel layer in which electrons mainly drift in low-noise operation, the third semiconductor layer is a carrier-supplying and second channel layer in which electrons mainly drift in high-power operation, the fourth semiconductor layer is a barrier layer, and the fifth semiconductor layer is a third channel layer in which electrons mainly drift in high-power operation.

The second semiconductor layer may comprise a first low-noise drift layer formed on the first semiconductor layer and having a greater electron affinity than that of the first semiconductor layer, and a second low-noise drift layer formed on the first low-noise drift layer, having a forbidden bandgap which is increased in a graded manner from the first low-noise drift layer toward the third semiconductor layer, and having an electron affinity which is equal to or smaller than that of the first low-noise drift layer on its surface on the side of the first low-noise drift layer and is equal to or greater than that of the third semiconductor layer on its surface on the side of the third semiconductor layer.

Alternatively, the second semiconductor layer may comprise a low-noise drift layer formed on the first semiconductor layer, having a forbidden bandgap which is increased in a graded manner from the first semiconductor layer toward the third semiconductor layer, and having an electron affinity which is greater than that of the first semiconductor layer on its surface on the side of the first semiconductor layer and is equal to or greater than that of the third semiconductor layer on its surface on the side of the third semiconductor layer.

Preferably, the fifth semiconductor layer has a thickness of approximately 40 to 100 Å. Each of the first to fifth semiconductor layers may be constituted by one or a plurality of layers.

The first semiconductor layer may be composed of a GaAs system, the second semiconductor layer may be composed of an InGaAs system, the third semiconductor layer may be composed of a GaAs system, the fourth semiconductor layer may be composed of an AlGaAs system, and the fifth semiconductor layer may be composed of an InGaAs system.

The first semiconductor layer may be composed of a double-layered structure of an InAlAs system and an InGaAs system, the second semiconductor layer may be composed of an InGaAs system, the third semiconductor layer may be composed of an InGaAs system, the fourth semiconductor layer may be composed of an InAlAs system, and the fifth semiconductor layer may be composed of an InGaAs system.

In the field effect semiconductor device, the electron affinity of the third semiconductor layer (carrier-supplying and second channel layer) is equal to or smaller than the electron affinity of the second semiconductor layer (first channel layer). When the field effect semiconductor device is operated by low-noise characteristics, that is, in the case of a deep applied gate voltage $V_{gs}$, therefore, carriers are supplied to the second semiconductor layer from the third semiconductor layer of the one conductivity type which is also used as a carrier-supplying layer, whereby the second semiconductor layer mainly becomes a carrier drift layer (low-noise drift layer), and the drifting carriers are localized in the second semiconductor layer.

Additionally, when the field effect semiconductor device is operated by high-power characteristics, that is, in the case of a shallow applied gate voltage $V_{gs}$, the third semiconductor layer (carrier-supplying and second channel layer) and the fifth semiconductor layer (third channel layer) mainly become carrier drift layers (high-power drift layers). Particularly, the fifth semiconductor layer in the third semiconductor layer or between the third semiconductor layer and the fourth semiconductor layer has a greater electron affinity than that of the third semiconductor layer and has a smaller forbidden bandgap than that of the third semiconductor layer, whereby a lot of carriers drift in the fifth semiconductor layer in which they can drift at higher velocity than that in the third semiconductor layer. As a result, the electrons drift at high velocity in high-power operation, whereby plateau shaped transconductance (gm)—applied gate voltage ($V_{gs}$) characteristics are obtained even if the gate length is small, thereby to reduce the distortion of an output signal in high-power operation. Therefore, if the field effect semiconductor device is used for a digital handy phone, for example, it is possible to restrain noises at the time of transmission.

In accordance with another aspect of the present invention, a field effect semiconductor device comprises an undoped first semiconductor layer, an undoped second semiconductor layer formed on the first semiconductor layer, a third semiconductor layer of one conductivity type formed on the second semiconductor layer, and a fourth semiconductor layer of the one conductivity type or undoped formed on the third semiconductor layer, the second semiconductor layer having an electron affinity which is greater than that of the first semiconductor layer on its surface on the side of the first semiconductor layer and is equal to or greater than that of the third semiconductor layer on its surface on the side of the third semiconductor layer, and the fourth semiconductor layer having an electron affinity which is equal to or smaller than that of the third semiconductor layer on its surface on the side of the third semiconductor layer, and further comprises an undoped fifth semiconductor layer formed between the second semiconductor layer and the third semiconductor layer and having an electron affinity approximately equal to that of the third semiconductor layer, first and second high conductive regions formed spaced apart from each other in a portion from the fourth semiconductor layer to at least the third semiconductor layer, first and second ohmic electrodes respectively formed on the first and second high conductive regions, and a Schottky electrode formed on a region between the first and second high conductive regions.

The first semiconductor layer is a buffer layer, the second semiconductor layer is a first channel layer in which electrons mainly drift in low-noise operation, the third semiconductor layer is a carrier-supplying and second channel layer in which electrons mainly drift in high-power operation, the fourth semiconductor layer is a barrier layer, and the fifth semiconductor layer is an impurity diffusion preventing layer. The fourth semiconductor layer may comprise a barrier layer having an electron affinity which is equal to or smaller than that of the third semiconductor layer on its surface on the side of the third semiconductor layer and a protective layer having an electron affinity which is equal to or greater than that of the barrier layer on its surface on the side of the barrier layer.

The second semiconductor layer may comprise a first low-noise drift layer formed on the first semiconductor layer and having a greater electron affinity than that of the first semiconductor layer, and a second low-noise drift layer formed on the first low-noise drift layer, having a forbidden bandgap which is increased in a graded manner from the first low-noise drift layer toward the third semiconductor layer, and having an electron affinity which is equal to or smaller than that of the first low-noise drift layer on its surface on the side of the first low-noise drift layer and is equal to or greater than that of the third semiconductor layer on its surface on the side of the third semiconductor layer.

Alternatively, the second semiconductor layer may comprise a low-noise drift layer formed on the first semiconductor layer, having a forbidden bandgap which is increased in a graded manner from the first semiconductor layer toward the third semiconductor layer, and having an electron affinity which is greater than that of the first semiconductor layer on its surface on the side of the first semiconductor layer and is equal to or greater than that of the third semiconductor layer on its surface on the side of the third semiconductor layer.

Preferably, the fifth semiconductor layer has a thickness of approximately 50 to 150 Å. It is preferable that the first and second high conductive regions reach the second semiconductor layer. Each of the first to fifth semiconductor layers may be constituted by one or a plurality of layers.

The buffer layer may be composed of a GaAs system, the first channel layer may be composed of an InGaAs system, the carrier-supplying and second channel layer may be composed of a GaAs system, the barrier layer may be composed of an AlGaAs system, and the impurity diffusion preventing layer may be composed of a GaAs system.

The buffer layer may be composed of a double-layered structure of an InAlAs system and an InGaAs system, the first channel layer may be composed of an InGaAs system, the carrier-supplying and second channel layer may be composed of an InGaAs system, the barrier layer may be composed of an InAlAs system, and the impurity diffusion preventing layer may be composed of an InGaAs system.

In the field effect semiconductor device, the undoped fifth semiconductor layer (impurity diffusion preventing layer) having an electron affinity approximately equal to that of the third semiconductor layer is provided between the second semiconductor layer (first channel layer) and the third semiconductor layer (carrier-supplying and second channel layer). Therefore, the fifth semiconductor layer prevents impurities from being diffused into the second semiconductor layer from the third semiconductor layer. As a result, the pinch-off characteristics of the drain current in the $I_{ds-Vgs}$ characteristics are improved.

The field effect semiconductor device may further comprise a sixth semiconductor layer of the one conductivity type or undoped formed in the third semiconductor layer or between the third semiconductor layer and the fourth semiconductor layer, having a greater electron affinity than that of the third semiconductor layer, and having a smaller forbidden bandgap than that of the third semiconductor layer. In this case, it is possible to reduce the distortion of a signal in high-power operation.

In accordance with still another aspect of the present invention, a method of fabricating a field effect semiconductor device comprises the steps of forming an undoped buffer layer on a semi-insulating semiconductor substrate, forming on the buffer layer an undoped first channel layer having an electron affinity which is greater than that of the buffer layer on its surface on the side of the buffer layer, forming on the first channel layer an undoped impurity diffusion preventing layer having an electron affinity which is equal to or smaller than that of the first channel layer on its surface on the side of the first channel layer, forming on the impurity diffusion preventing layer a carrier-supplying and second channel layer of one conductivity type having an electron affinity approximately equal to that of the impurity diffusion preventing layer, forming on the carrier-supplying and second channel layer a barrier layer or a barrier and protective layer of the one conductivity type or undoped having an electron affinity which is equal to or smaller than that of the carrier-supplying and second channel layer on its surface on the side of the carrier-supplying and second channel layer, forming first and second high conductive regions spaced apart from each other in a portion from the barrier layer or the barrier and protective layer to at least the carrier-supplying and second channel layer by ion implantation and heat treatment, and respectively forming first and second ohmic electrodes on the first and second high conductive regions and forming a Schottky electrode on a region between the first and second high conductive regions.

In accordance with a further aspect of the present invention, a field effect semiconductor device comprises a first channel layer comprising an undoped semiconductor in which electrons mainly drift in low-noise operation, and a second channel layer comprising a semiconductor of one conductivity type in which electrons mainly drift in high-power operation, at least one semiconductor layer of the one conductivity type or undoped having a greater electron affinity than that of the second channel layer and having a smaller forbidden bandgap than that of the second channel layer being provided in the second channel layer or on the second channel layer on the opposite side of the first channel layer.

In accordance with a still further aspect of the present invention, a field effect semiconductor device comprises a first channel layer comprising an undoped semiconductor in which electrons mainly drift in low-noise operation, a second channel layer comprising a semiconductor of one conductivity type in which electrons mainly drift in high-power operation, and an undoped impurity diffusion preventing layer formed between the first channel layer and the second channel layer and having an electron affinity approximately equal to that of the second channel layer.

"Graded" includes a continuously linear or curved change and a step-shaped change.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(1) First Embodiment

Figure 1:
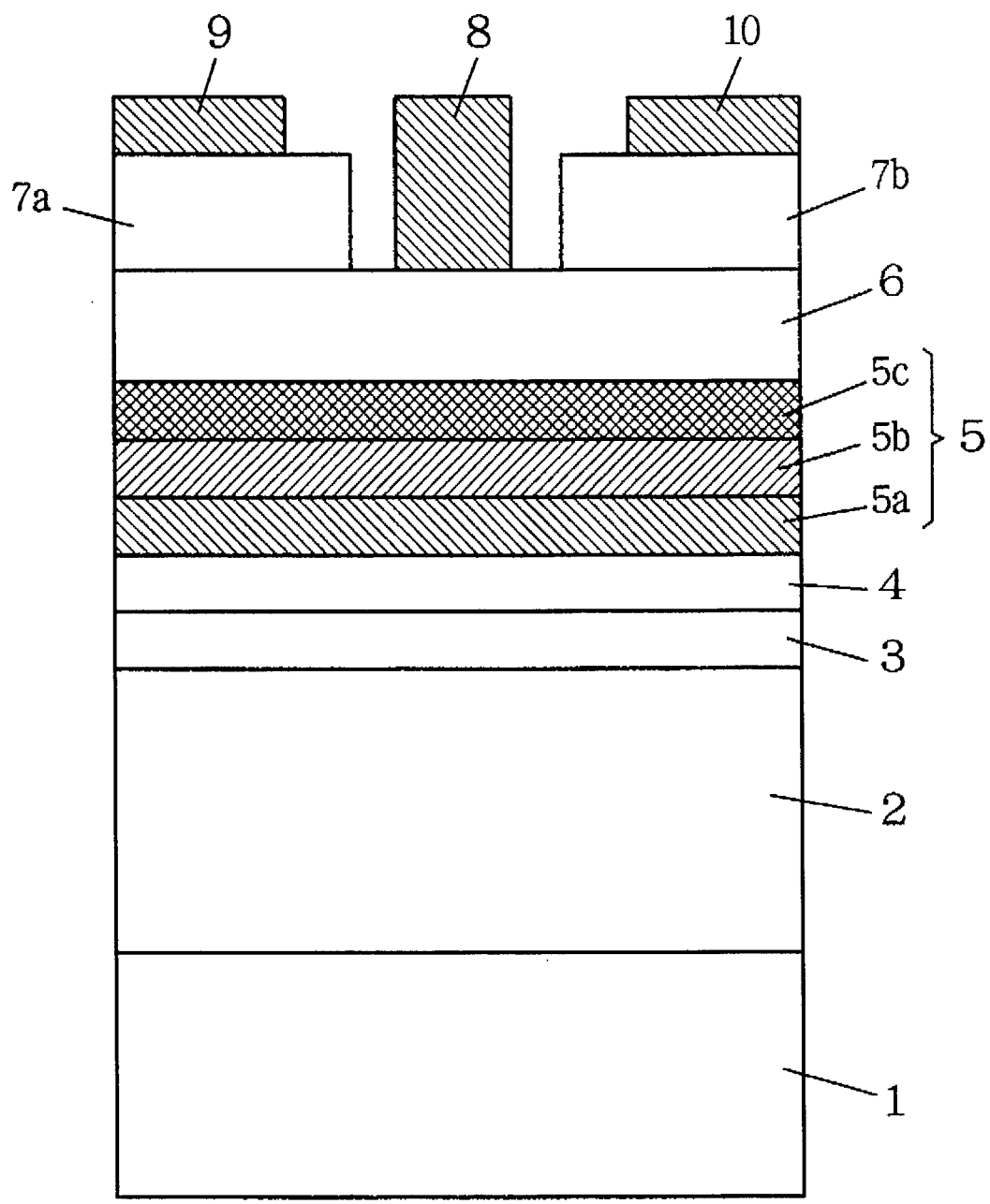
FIG. 1 is a schematic cross sectional view showing a principal part of a TMT device according to a first embodiment of the present invention.

A TMT device according to a first embodiment of the present invention will be described with reference to FIG. 1. In FIG. 1, a buffer layer 2 composed of undoped GaAs (a first semiconductor layer), a channel layer 3 composed of undoped $In_xGa_{1-x}As$ (x>0) (a second semiconductor layer; hereinafter referred to as a first low-noise drift layer), and a channel layer 4 composed of undoped graded $In_yGa_{1-y}As$ (a second semiconductor layer or a graded layer; hereinafter referred to as a second low-noise drift layer) are formed in that order on a semi-insulating semiconductor substrate 1 composed of GaAs.

The first low-noise drift layer 3 has a greater electron affinity than that of the buffer layer 2. The In composition ratio y in the second low-noise drift layer 4 is decreased in a graded manner upward from the side of the substrate 1 (y is changed in the range of x≧y≧0), and the forbidden bandgap thereof is increased in a graded manner upward from the side of the substrate 1. Further, the second low-noise drift layer 4 has an electron affinity which is equal to or smaller than the electron affinity of the first low-noise drift layer 3 on its surface on the side of the layer 3 and is equal to or greater than the electron affinity of a first high-power drift layer 5a as described later on its surface on the side of the layer 5a.

An n-type electron-supplying and channel layer (hereinafter referred to as a high-power drift layer) 5 having a high carrier density is formed on the second low-noise drift layer 4. The n-type high-power drift layer 5 comprises a first high-power drift layer 5a composed of n-type GaAs (a third semiconductor layer), a second high-power drift layer 5b composed of n-type $In_tGa_{1-t}As$ (t>0) (a fifth semiconductor layer), and a third high-power drift layer 5c composed of n-type GaAs (a third semiconductor layer). The second high-power drift layer 5b has a greater electron affinity and a smaller forbidden bandgap than those of the first high-power drift layer 5a. The third high-power drift layer 5c has a smaller electron affinity than that of the second high-power drift layer 5b. It is preferable that the thickness of the second high-power drift layer 5b is approximately 40 to 100 Å.

A barrier layer 6 composed of n-type $Al_zGa_{1-z}As$ (z>0) (a fourth semiconductor layer) is formed on the high-power drift layer 5. The barrier layer 6 has an electron affinity which is equal to or smaller than the electron affinity of the high-power drift layer 5 on its surface on the side of the layer 5. Cap layers 7a and 7b composed of n-type GaAs are formed spaced apart from each other on the barrier layer 6.

A gate electrode 8 having an Al/Ti structure in Schottky contact with the barrier layer 6 is formed on the barrier layer 6 between the cap layers 7a and 7b and a source electrode 9 and a drain electrode 10 having an Au/Ni/Au—Ge structure in ohmic contact with the cap layers 7a and 7b are respectively formed on the cap layers 7a and 7b.

Table 1 and Table 2 respectively show a sample A and a sample B of the TMT device according to the present embodiment, and Table 3 shows a sample X of a TMT device in a comparative example. The sample A shown in Table 1 has the structure shown in FIG. 1. The sample B shown in Table 2 has the same structure as that of the sample A except that it does not have the first low-noise drift layer 3. The sample X shown in Table 3 has the same structure as that of the sample A except that it does not have the second high-power drift layer 5b.

The gate length and the gate width in each of the samples A, B and X are respectively 0.12 μm and 200 μm, and the low-noise drift layers or the high-power drift layers in the samples differ in the thickness.

TABLE 1

| name | material | thickness/carrier density(n) |
| --- | --- | --- |
| semiconductor substrate 1 | GaAs | — |
| buffer layer 2 | u-GaAs | 8000 Å |
| first low-noise drift layer 3 | u-$In_{0.2}Ga_{0.8}As$ | 50 Å |
| second low-noise drift layer 4 | u-$In_yGa_{1-y}As$ y = 0.2[substrate side] →y = 0[upper side] | 50 Å |
| first high-power drift layer 5a | n-GaAs | 150 Å |
| second high-power drift layer 5b | n-$In_{0.1}Ga_{0.9}As$ | 100 Å |
| third high-power drift layer 5c | n-GaAs | 150 Å |
| barrier layer 6 | n-$Al_{0.22}Ga_{0.78}As$ | 400 Å n = 2 × $10^{18}$ cm$^{-3}$ |
| cap layer 7a, 7b | n-GaAs | 500 Å n = 3 × $10^{18}$cm$^{-3}$ |

The carrier densities n of the first to third high-power drift layers 5a, 5b and 5c are 1.5×$10^{18}$ cm$^{-3}$.

TABLE 2

| name | material | thickness/carrier density(n) |
|---|---|---|
| semiconductor substrate 1 | GaAs | — |
| buffer layer 2 | u-GaAs | 8000 Å |
| first low-noise drift layer 3 | — | — |
| second low-noise drift layer 4 | u-In$_y$Ga$_{1-y}$As<br>y = 0.2[substrate side]<br>→y = 0[upper side] | 100 Å |
| first high-power drift layer 5a | n-GaAs | 150 Å |
| second high-power drift layer 5b | n-In$_{0.1}$Ga$_{0.9}$As | 100 Å |
| third high-power drift layer 5b | n-GaAs | 150 Å |
| barier layer 5c | n-Al$_{0.22}$Ga$_{0.78}$As | 400 Å<br>n = 2 ×10$^{18}$cm$^{-3}$ |
| cap layer 7a,7b | n-GaAs<br>n=3 × 10$^{18}$cm$^{-3}$ | 500 Å |

The carrier densities n of the first to third high-power drift layers 5a, 5b and 5c are 1.5×10$^{18}$ cm$^{-3}$.

TABLE 3

| name | material | thickness/carrier density(n) |
|---|---|---|
| semiconductor substrate 1 | GaAs | — |
| buffer layer 2 | u-GaAs | 8000 Å |
| first low-noise drift layer 3 | u-In$_{0.2}$Ga$_{0.8}$As | 50 Å |
| second low-noise drift layer 4 | u-In$_y$Ga$_{1-y}$As<br>y = 0.2[substrate side]<br>→y = 0[upper side] | 50 Å |
| high-power drift layer 5 | n-GaAs | 400 Å |
| barrier layer 6 | n-Al$_{0.22}$Ga$_{0.78}$As | 400 Å<br>n = 2 × 10$^{18}$cm$^{-3}$ |
| cap layer 7a,7b | n-GaAs | 500 Å<br>n = 3 × 10$^{18}$cm$^{-3}$ |

The carrier density n of the high-power drift layer 5 is 1.5×10$^{18}$ cm$^{-3}$.

The samples A, B and X were prepared, to measure the transconductance (gm)—applied gate voltage ($V_{gs}$) characteristics as well as measure the minimum noise figure (NF$_{min}$) in a frequency of 12 GHz at a deep applied gate voltage $V_{gs}$ (a drain-source voltage $V_{ds}$=2 [V], and a drain-source current $I_{ds}$=10 [mA]) with respect to the samples.

Figure 2:
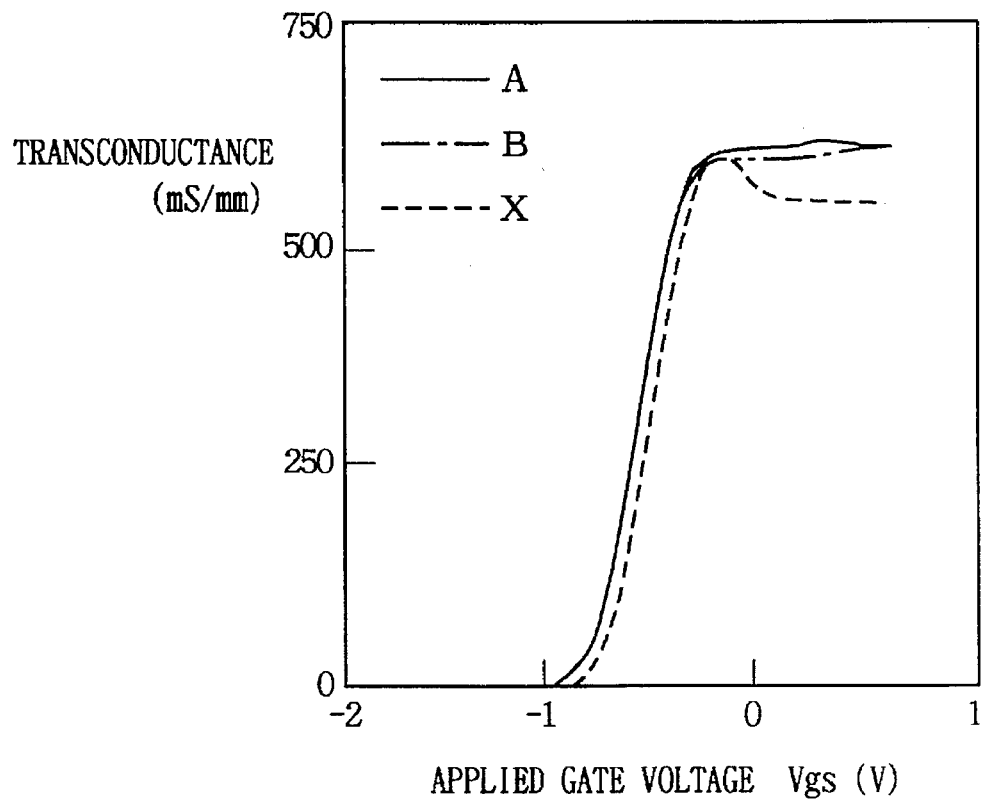
FIG. 2 is a diagram showing the transconductance (gm) —applied gate voltage ($V_{gs}$) characteristics in two samples A and B in the first embodiment and a sample X in a comparative example.

FIG. 2 shows the gm—$V_{gs}$ characteristics in the samples A, B and X. In FIG. 2, a solid line, a one-dot and dash line and a dotted line respectively indicate the results of the measurement with respect to the sample A, the sample B and the sample X.

As can be seen from FIG. 2, in the samples A and B according to the present embodiment which has in the high-power drift layer 5 the second high-power drift layer 5b having a great electron affinity and having a small forbidden bandgap, the transconductance (gm) is approximately constant in a case where the applied gate voltage $V_{gs}$ is shallow (about –0.5 to about 0.5 [V]), as compared with the sample X in the comparative example which does not have the second high-power drift layer 5b.

Table 4 shows the NF$_{min}$ characteristics in the samples A, B and X.

TABLE 4

|  | sample A | sample B | sample X |
|---|---|---|---|
| NF$_{min}$[dB] | 0.43 | 0.46 | 0.44 |

As shown in Table 4, the minimum noise figures (NF$_{min}$) in the samples A and B in the present embodiment and the sample X in the comparative example are in the range of 0.43 to 0.46 dB and are approximately equal to each other, so that all the samples A, B and X have super-low-noise characteristics. As can be seen from the result, even if the second high-power drift layer 5b having a great electron affinity and a small forbidden bandgap is provided in the high-power drift layer 5, low-noise characteristics are obtained as in the conventional device in a case where the applied gate voltage $V_{gs}$ is deep.

Figure 3:
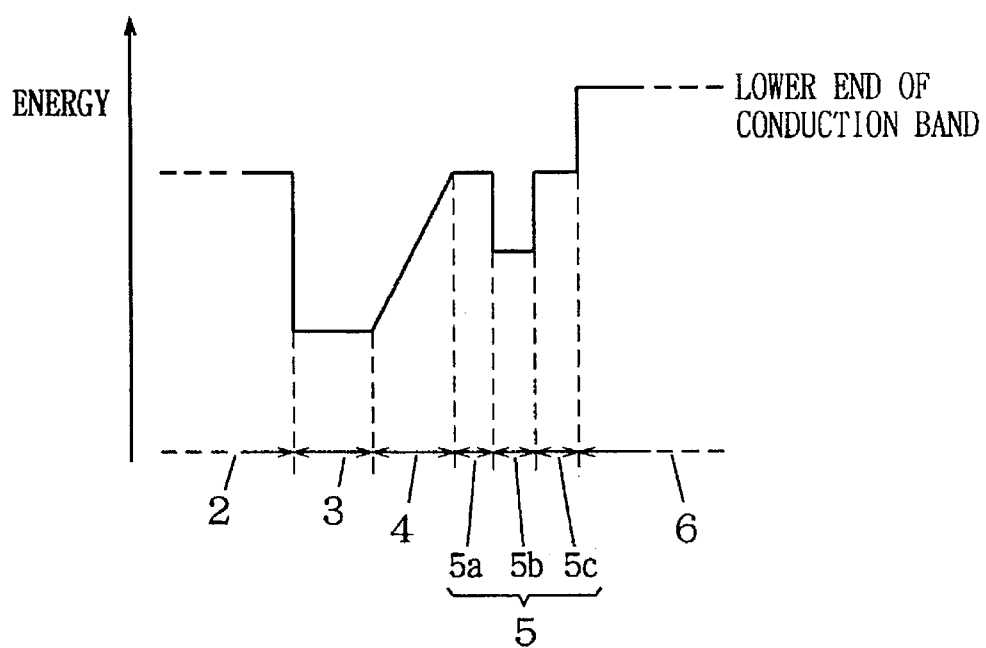
FIG. 3 is an energy band diagram in a lower end of a conduction band of a principal part of the sample A in the first embodiment.

The reason why the transconductance (gm) in the gm—$V_{gs}$ characteristics is approximately constant (plateau shaped) in high-power operation in which the applied gate voltage $V_{gs}$ is shallow as shown in FIG. 2 will be described with reference to FIG. 3. FIG. 3 is an energy band diagram in a lower end of a conduction band in a field-free of the sample A of the TMT device.

As shown in FIG. 3, energy in the lower end of conduction band of the first and second low-noise drift layers 3 and 4 is not higher than energy in the lower end of the conduction band of the first high-power drift layer 5a, whereby electrons are supplied to the first and second low-noise drift layers 3 and 4 from the high-power drift layer 5a. Further, the energy in the lower end of the conduction band of the first low-noise drift layer 3 is not higher than energy in the lower end of conduction band of the buffer layer 2 and the first high-power drift layer 5a, whereby the supplied electrons are localized in the first low-noise drift layer 3 and the second low-noise drift layer 4 adjacent to the layer 3. Consequently, the localized electrons are not easily affected by impurities in the first high-power drift layer 5a serving as an electron-supplying layer, whereby the electrons in the first and second low-noise drift layers 3 and 4 drift at high velocity, as in the conventional device. The high velocity of the electrons is thus maintained in low-noise operation.

Additionally, the second high-power drift layer 5b interposed between the first and third high-power drift layers 5a and 5c is provided in the high-power drift layer 5. Since the second high-power drift layer 5b has a greater electron affinity than those of the first and third high-power drift layers 5a and 5c, more electrons are gathered in the second high-power drift layer 5b than the first and third high-power drift layers 5a and 5c. Further, the second high-power drift layer 5b has a smaller forbidden bandgap than those of the first and third high-power drift layers 5a and 5c. The smaller the forbidden bandgap is, the smaller the effective mass of electrons is, whereby electrons drift at higher velocity in a layer having a smaller forbidden bandgap. Consequently, electrons drift at higher velocity in the second high-power drift layer 5b, as compared with the first and third high-power drift layers 5a and 5b.

Moreover, the first and second low-noise drift layers 3 and 4 are separated from the second high-power drift layer 5b by the first high-power drift layer 5a, whereby the electrons in the first and second low-noise drift layers 3 and 4 are not affected by impurities in the second high-power drift layer 5b in low-noise operation. As a result, the velocity of the electrons in the high-power drift layer 5 can be increased in high-power operation without degrading the characteristics in low-noise operation.

The velocity of the electrons in high-power operation is thus made higher than that in the conventional device. Even if the gate length is small, therefore, the gm—$V_{gs}$ characteristics are approximately constant (plateau shaped) in a case where the applied gate voltage $V_{gs}$ is shallow.

Also in the sample B which does not have the first low-noise drift layer 3, electrons are supplied to the second low-noise drift layer 4 from the first high-power drift layer 5a as in the sample A, and the supplied electrons are localized in the second low-noise drift layer 4. Consequently, the electrons in the second low-noise drift layer 4 are not easily affected by impurities in the first high-power drift layer 5a, whereby the electrons in the second low-noise drift layer 4 drift at high velocity. Moreover, the second high-power drift layer 5b having a great electron affinity and having a small forbidden bandgap is provided in the high-power drift layer 5, whereby the velocity of the electrons drifting in the high-power drift layer 5 can be increased in the same manner.

In the samples A and B according to the embodiment, the second high-power drift layer 5b having a great electron affinity and having a small forbidden bandgap is provided in the high-power drift layer 5, thereby to make it possible to reduce the distortion of a signal in high-power operation.

If the same relationship as that in the TMT device according to the present embodiment is satisfied with respect to the electron affinity and the forbidden bandgap, the same effect is obtained even if conditions such as the material of each layer are suitably changed. Table 5 and Table 6 show examples of a TMT device using an InP substrate.

Table 5 shows another TMT device corresponding to the structure of the sample A, and Table 6 shows another TMT device corresponding to the structure of the sample B. In the TMT devices shown in Table 5 and 6, portions corresponding to those in the TMT device shown in FIG. 1 are assigned the same reference numerals and hence, the description thereof is not repeated.

TABLE 5

| name | material | thickness/carrier density(n) |
|---|---|---|
| semiconductor substrate 1 | InP | — |
| buffer layer 2 | | |
| substrate 1 side | u-$In_{0.52}Al_{0.48}As$ | 2000 Å |
| layer 3 side | u-$In_{0.53}Ga_{0.47}As$ | 500 Å |
| first low-noise drift layer 3 | u-$In_{0.73}Ga_{0.27}As$ | 50 Å |
| second low-noise drift layer 4 | u-$In_yGa_{1-y}As$ y = 0.73 →y = 0.53[upper side] | 50 Å |
| first high-power drift layer 5a | n-$In_{0.53}Ga_{0.47}As$ | 100 Å |
| second high-power drift layer 5b | n-$In_tGa_{1-t}As$ : where t > 0.53 | 100 Å |
| third high-power drift layer 5c | n-$In_{0.53}Ga_{0.47}As$ | 100 Å |
| barrier layer 6 | u-$In_{0.52}Al_{0.48}As$ | 200 Å |
| cap layer 7a,7b | n-$In_{0.53}Ga_{0.47}As$ | 500 Å |
| | | n = 3 × $10^{18}$cm$^{-3}$ |

The carrier densities n of the first to third high-power drift layers 5a, 5b and 5c are 2.5×$10^{18}$ cm$^{-3}$.

TABLE 6

| name | material | thickness/carrier density(n) |
|---|---|---|
| semiconductor substrate 1 | InP | — |
| buffer layer 2 | | |
| substrate 1 side | u-$In_{0.52}Al_{0.48}As$ | 2000 Å |
| layer 3 side | u-$In_{0.53}Ga_{0.47}As$ | 500 Å |
| first low-noise drift layer 3 | — | — |
| second low-noise drift layer 4 | u-$In_yGa_{1-y}As$ y = 0.73 →y = 0.53[upper side] | 100 Å |
| first high-power drift layer 5a | n-$In_{0.53}Ga_{0.47}As$ | 100 Å |
| second high-power drift layer 5b | n-$In_tGa_{1-t}As$ : where t > 0.53 | 100 Å |
| third high-power drift layer 5c | n-$In_{0.53}Ga_{0.47}As$ | 100 Å |
| barrier layer 6 | u-$In_{0.52}Al_{0.48}As$ | 200 Å |
| cap layer 7a,7b | n-$In_{0.53}Ga_{0.47}As$ | 500 Å |
| | | n = 3 × $10^{18}$cm$^{-3}$ |

The carrier densities n of the first to third high-power drift layers 5a, 5b and 5c are 2.5×$10^{18}$ cm$^{-3}$.

As shown in Table 5 and Table 6, in the TMT devices using such an InP substrate, it is preferable to use a double-layered structure of a buffer layer composed of an undoped InAlAs system semiconductor and a buffer layer composed of an undoped InGaAs system semiconductor as the buffer layer 2, and the latter buffer layer corresponds to the first semiconductor layer.

In the TMT device according to the present embodiment, the third high-power drift layer 5c may not be provided. That is, the second high-power drift layer 5b (the fifth semiconductor layer) may be provided between the first high-power drift layer 5a (the third semiconductor layer) and the barrier layer 6 (the fourth semiconductor layer).

(2) Second Embodiment

Figure 4:
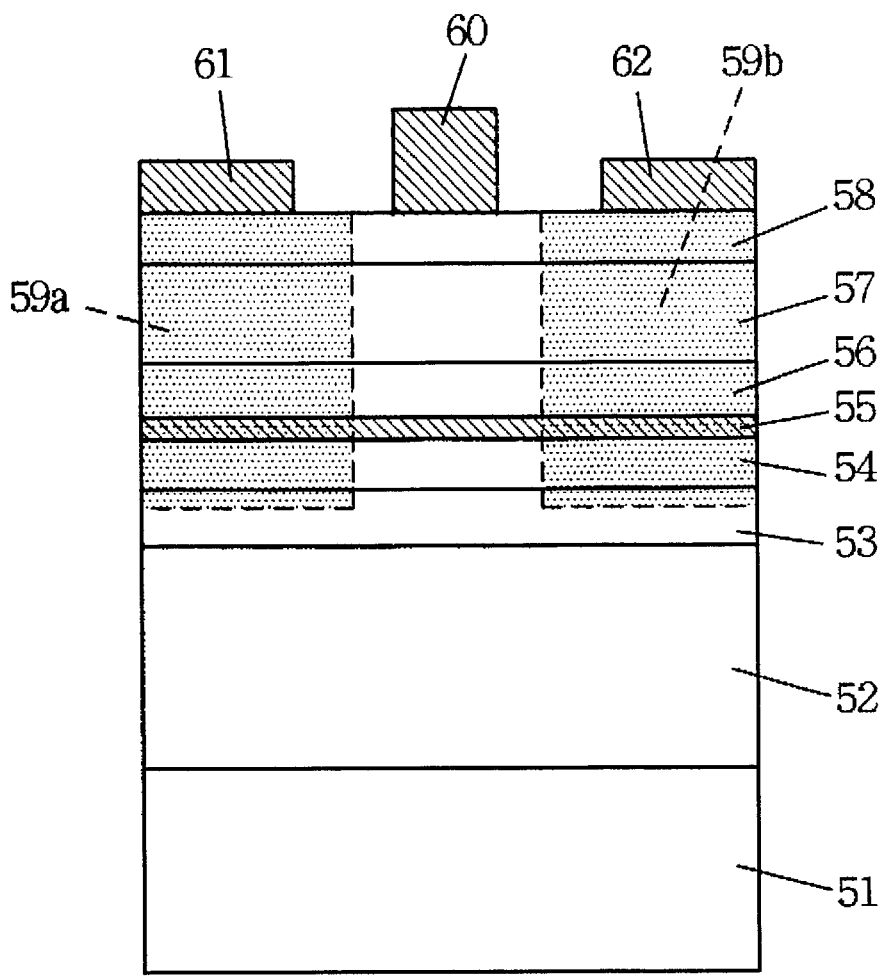
FIG. 4 is a schematic cross sectional view showing a principal part of a TMT device according to a second embodiment of the present invention.
Figure 5:
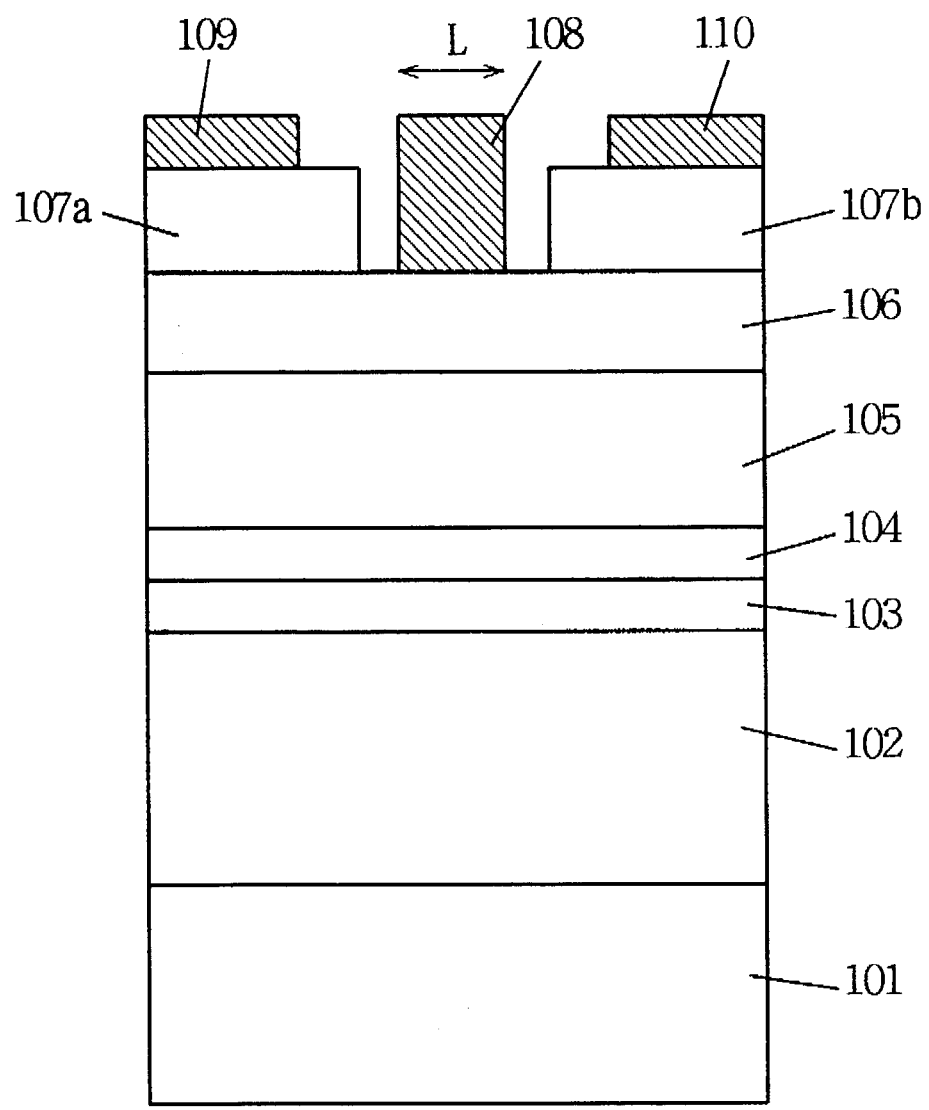
FIG. 5 is a schematic cross sectional view showing a principal part of a conventional TMT device.

A planar-type TMT device according to a second embodiment of the present invention will be described with reference to FIG. 4. FIG. 4 is a schematic cross sectional view showing a principal part of the TMT device according to the second embodiment.

In FIG. 4, a buffer layer 52 composed of undoped GaAs (a first semiconductor layer), a channel layer 53 composed of undoped $In_xGa_{1-x}As$ (x>0) (a second semiconductor layer; hereinafter referred to as a first low-noise drift layer), and a channel layer 54 composed of undoped graded $In_yGa_{1-y}As$ (a second semiconductor layer; hereinafter referred to as a second low-noise drift layer) are formed in that order on a semi-insulating semiconductor substrate 51 composed of GaAs.

The electron affinity of the first low-noise drift layer 53 is greater than the electron affinity of the buffer layer 52. The In composition ratio y in the second low-noise drift layer 54 is decreased in a graded manner upward from the side of the substrate 51 (y is changed in the range of x≧y≧0), and the forbidden bandgap thereof is increased in a graded manner upward from the side of the substrate 1. The second low-noise drift layer 54 has an electron affinity which is equal to or smaller than the electron affinity of the first low-noise drift layer 53 on its surface on the side of the layer 53 and is equal to or greater than the electron affinity of an impurity diffusion preventing layer 55 as described layer on its surface on the side of the layer 55.

An impurity diffusion preventing layer 55 composed of undoped GaAs (a fifth semiconductor layer) is formed on the second low-noise drift layer 54. An electron-supplying and channel layer 56 composed of n-type GaAs having a high carrier density (a third semiconductor layer; hereinafter referred to as a high-power drift layer), a barrier layer 57 composed of undoped $Al_zGa_{1-z}As$ (z>0) (a fourth semiconductor layer), and a protective layer 58 composed of undoped GaAs are formed in that order on the impurity diffusion preventing layer 55.

The electron affinity of the impurity diffusion preventing layer 55 is approximately equal to the electron affinity of the high-power drift layer 56. The barrier layer 57 has an electron affinity which is equal to or smaller than the electron affinity of the high-power drift layer 56 on its surface on the side of the layer 56. The protective layer 58 has an electron affinity which is equal to or greater than the electron affinity of the barrier layer 57 on its surface on the side of the layer 57.

n-type high conductive regions 59a and 59b are formed spaced apart from each other in a portion from the protective layer 58 to the first low-noise drift layer 53. A gate electrode 60 having an Al/Ti structure in Schottky contact with the protective layer 58 is formed on the protective layer 58 between the high conductive regions 59a and 59b. A source electrode 61 having an Au/Ni/Au—Ge structure in ohmic contact with the protective layer 58 is formed on the high conductive region 59a, and a drain electrode 62 having an Au/Ni/Au—Ge structure in ohmic contact with the protective layer 58 is formed on the high conductive region 59b.

The above described TMT device is fabricated in the following manner, for example. The buffer layer 52, the first low-noise drift layer 53, the second low-noise drift layer 54, the impurity diffusion preventing layer 55, the high-power drift layer 56, the barrier layer 57 and the protective layer 58 are first continuously grown in that order on the semi-insulating semiconductor substrate 51 by the molecular beam epitaxy (MBE) method. A dopant in an n-type layer of the TMT device according to the present embodiment is Si.

A mask in a desired shape made of $Si_3N_4$, $SiO_2$ or the like is then formed on the protective layer 58. Impurities such as Si are implanted by ion implantation in a state where the mask is formed. Thereafter, ion implanted portions are annealed at 800° to 950° C. for a predetermined time period, desirably at 850° C. for five seconds so as to make the carrier density of the ion implanted portion high, thereby to form the n-type high conductive regions 59a and 59b.

The high conductive regions 59a and 59b are so formed as to reach at least the high-power drift layer 56 from the protective layer 58. Although it is preferable that the high conductive regions 59a and 59b reach the first low-noise drift layer 53, it is not preferable that they reach the vicinity of the buffer layer 52 because a region between the source electrode 61 and the drain electrode 62 is liable to be short-circuited.

Table 7 and Table 8 respectively show a sample C and a sample D of the TMT device according to the present embodiment, and Table 9 shows a sample Y of a TMT device in a comparative example. The sample C shown in Table 7 has the structure shown in FIG. 4. The sample D shown in Table 8 has the same structure as that of the sample C except that it does not have the first low-noise drift layer 53. The sample Y shown in Table 9 has the same structure as that of the sample C except that it does not have the impurity diffusion preventing layer 55.

The gate length and the gate width in each of the samples C, D and Y are respectively 0.25 μm and 200 μm, and the low-noise drift layers or the high-power drift layers in the samples differ in the thickness.

TABLE 7

| name | material | thickness/carrier density(n) |
|---|---|---|
| semiconductor substrate 51 | GaAs | — |
| buffer layer 52 | u-GaAs | 8000 Å |
| first low-noise drift layer 53 | u-$In_{0.2}Ga_{0.8}As$ | 50 Å |
| second low-noise drift layer 54 | u-$In_yGa_{1-y}As$ y = 0.2 →y = 0[upper side] | 50 Å |
| diffusion preventing layer 55 | u-GaAs | 50 Å |
| high-power drift layer 56 | n-GaAs | 200 Å n = 3 × $10^{18}$cm$^{-3}$ |
| barrier layer 57 | u-$Al_{0.22}Ga_{0.78}As$ | 150 Å |
| protective layer 58 | u-GaAs | 50 Å |

TABLE 8

| name | material | thickness/carrier density(n) |
|---|---|---|
| semiconductor substrate 51 | GaAs | — |
| buffer layer 52 | u-GaAs | 8000 Å |
| first low-noise drift layer 53 | — | — |
| second low-noise drift layer 54 | u-$In_yGa_{1-y}As$ y = 0.2 →y = 0[upper side] | 100 Å |
| diffusion preventing layer 55 | u-GaAs | 50 Å |
| high-power drift layer 56 | n-GaAs | 200 Å n = 3 × $10^{18}$cm$^{-3}$ |
| barrier layer 57 | u-$Al_{0.22}Ga_{0.78}As$ | 150 Å |
| protective layer 58 | u-GaAs | 50 Å |

TABLE 9

| name | material | thickness/carrier density(n) |
|---|---|---|
| semiconductor substrate 51 | GaAs | — |
| buffer layer 52 | u-GaAs | 8000 Å |
| first low-noise drift layer 53 | u-$In_{0.2}Ga_{0.8}As$ | 50 Å |
| second low-noise drift layer 54 | u-$In_yGa_{1-y}As$ y = 0.2 →y = 0[upper side] | 50 Å |
| diffusion preventing layer 55 | — | — |
| high-power drift layer 56 | n-GaAs | 250 Å n = 3 × $10^{18}$cm$^{-3}$ |
| barrier layer 57 | u-$Al_{0.22}Ga_{0.78}As$ | 150 Å |
| protective layer 58 | u-GaAs | 50 Å |

The samples C, D and Y were prepared, and the transconductance (gm) at a drain current $I_{ds}$=10 [mA] was measured with respect to the samples C, D and Y in order to examine whether the pinch-off characteristics of a drain current in drain current ($I_{ds}$)—applied gate voltage ($V_{gs}$) characteristics are good.

Table 10 shows the transconductance (gm) and the maximum transconductance ($gm_{max}$) for reference.

TABLE 10

| | sample C | sample D | sample Y |
|---|---|---|---|
| $gm_{max}$ | 550 | 535 | 547 |
| gm | 365 | 325 | 255 |

In Table 10, the unit is mS/mm.

As can be seen from Table 10, the sample C in the present embodiment and the sample Y in the comparative example which have the same structure except for the presence or absence of the impurity diffusion preventing layer 55 have approximately the same maximum transconductance ($gm_{max}$), while the transconductance (gm) of the sample C in the present embodiment becomes 365 mS/mm, which is greatly improved from 255 mS/mm of the sample Y in the comparative example.

Furthermore, the sample D in the present embodiment and the sample Y in the comparative example similarly have approximately the same maximum transconductance ($gm_{max}$), while the transconductance (gm) of the sample D in the present embodiment becomes 325 mS/mm, which is greatly improved from 255 mS/mm of the sample Y in the comparative example. That is, even in the structure which does not have the first low-noise drift layer 53, the transconductance (gm) is greatly improved, as in the structure which has the first low-noise drift layer 53.

According to the structure in the present embodiment which has the undoped impurity diffusion preventing layer (the fifth semiconductor layer) 55 formed between the high-power drift layer 56 and the second low-noise drift layer 54 and having an electron affinity approximately equal to that of the high-power drift layer 56, the transconductance (gm) is thus significantly increased, as compared with that in the structure in the comparative example which does not have the impurity diffusion preventing layer 55, whereby the pinch-off characteristics are improved.

The reason for this is conceivably that in the annealing process for forming the high conductive regions 59a and 59b, dopants in the high-power drift layer 56 having a high carrier density are prevented from being diffused into the undoped first and second low-noise drift layers 53 and 54 by providing the impurity diffusion preventing layer 55.

It is preferable that the thickness of the impurity diffusion preventing layer 55 is set to a value at which carriers can be supplied into the low-noise drift layers 53 and 54 from the high-power drift layer 56, that is, approximately 50 to 150 Å.

(3) Third Embodiment

Description is now made of a TMT device according to a third embodiment of the present invention. Since the TMT device according to the third embodiment and the TMT device according to the second embodiment are different from each other in conditions such as the material and the thickness of each layer, while being the same in the relationships such as the electron affinity and the forbidden bandgap between layers, portions corresponding to those in the TMT device shown in FIG. 4 are assigned the same reference numerals and hence, the description thereof is not repeated.

Table 11 shows a sample E of the TMT device according to the present embodiment, and Table 12 shows a sample Z of a TMT device in a comparative example. The sample Z has the same structure as that of the sample E except that it does not have an impurity diffusion preventing layer 55.

The gate length and the gate width of each of the samples E and Z are respectively 0.25 μm and 200 μm, and high-power drift layers in the samples differ in the thickness.

TABLE 11

| name | material | thickness/carrier density(n) |
|---|---|---|
| semiconductor substrate 51 | InP | — |
| buffer layer 52 | | |
| substrate 51 side layer 53 side | u-$In_{0.52}Al_{0.48}As$ | 2000 Å |
| | u-$In_{0.53}Ga_{0.47}As$ | 500 Å |
| first low-noise drift layer 53 | u-$In_{0.73}Ga_{0.27}As$ | 50 Å |
| second low-noise drift layer 54 | u-$In_yGa_{1-y}As$ y = 0.73 →y = 0.53[upper side] | 50 Å |
| diffusion preventing layer 55 | u-$In_{0.53}Ga_{0.47}As$ | 50 Å |
| high-power drift layer 56 | n-$In_{0.53}Ga_{0.47}As$ | 200 Å n = 3 × $10^{18}cm^{-3}$ |
| barrier layer 57 | u-$In_{0.52}Ga_{0.48}As$ | 150 Å |
| protective layer 58 | u-$In_{0.53}Ga_{0.47}As$ | 50 Å |

TABLE 12

| name | material | thickness/carrier density(n) |
|---|---|---|
| semiconductor substrate 51 | InP | — |
| buffer layer 52 | | |
| substrate 51 side layer 53 side | u-$In_{0.52}Al_{0.48}As$ | 2000 Å |
| | u-$In_{0.53}Ga_{0.47}As$ | 500 Å |
| first low-noise drift layer 53 | u-$In_{0.73}Ga_{0.27}As$ | 50 Å |
| second low-noise drift layer 54 | u-$In_yGa_{1-y}As$ y = 0.73 →y = 0.53[upper side] | 50 Å |
| diffusion preventing layer 55 | — | — |
| high-power drift layer 56 | n-$In_{0.53}Ga_{0.47}As$ | 200 Å n = 3 × $10^{18}cm^{-3}$ |
| barrier layer 57 | u-$In_{0.52}Ga_{0.48}As$ | 150 Å |
| protective layer 58 | u-$In_{0.53}Ga_{0.47}As$ | 50 Å |

The samples E and Z were prepared, and the transconductance (gm) at a drain current $I_{ds}$=20 [mA] was measured with respect to the samples E and Z in order to examine whether the pinch-off characteristics of a drain current in drain current ($I_{ds}$)—applied gate voltage ($V_{gs}$) characteristics are good.

Table 13 shows the transconductance (mg) and the maximum transconductance ($gm_{max}$) for reference.

TABLE 13

| | sample E | sample Z |
|---|---|---|
| $gm_{max}$ | 1050 | 1045 |
| gm | 775 | 600 |

In Table 13, the unit is mS/mm.

As can be seen from Table 13, the sample E in the present embodiment and the sample Z in the comparative example which have the same structure except for the presence or absence of the impurity diffusion preventing layer 55 have approximately the same maximum transconductance ($gm_{max}$), while the transconductance (gm) of the sample E in the present embodiment becomes 775 mS/mm, which is greatly improved from 600 mS/mm of the sample Z in the comparative example.

According to the structure in the present embodiment which has the impurity diffusion preventing layer 55, which differs from that in the second embodiment in the material or the like, the transconductance (gm) is thus significantly increased due to the presence of the impurity diffusion preventing layer 55, as compared with that in the structure in the comparative example which does not have the impurity diffusion preventing layer 55, whereby the pinch-off characteristics are improved.

(4) Another Modified Example

In the above described TMT device having the high conductive regions 59a and 59b, if the barrier layer 57 is composed of a semiconductor containing Al, the surface thereof is liable to be oxidized so that respective electrodes are not brought into good contact with the barrier layer 57. Accordingly, it is preferable to use a protective layer 58. If another semiconductor material which is not oxidized is selected as the material of the barrier layer 57, for example, respective electrodes may be formed on the barrier layer 57 without using the protective layer 58.

For example, the TMT device shown in Table 11 may be so constructed that the InGaAs system protective layer 58 does not exist in a portion where the gate electrode 60 is formed. In this case, the gate electrode 60 is brought into Schottky contact with the InAlAs system barrier layer 57. An InGaAs system has a significantly lower Schottky barrier height than those of an AlGaAs system, an InAlAs system and a GaAs system. Consequently, the gate electrode 60 is brought into Schottky contact with the InAlAs system barrier layer 57 having a high Schottky barrier height, whereby the gate breakdown voltage is increased. The gate breakdown voltage Vr (Ir=100 [μA]) of the TMT device shown in Table 11 is 2 V, while the gate breakdown voltage Vr can be increased to a very large value of 4 V if the gate electrode 60 is brought into Schottky contact with the barrier layer 57.

Furthermore, also in the TMT device having the high conductive regions 59a and 59b, the high-power drift layer 56 may be provided with a semiconductor layer of the same conductivity type as that of the layer 56 or undoped which has a greater electron affinity and has a smaller forbidden bandgap than those of the layer 56, as in the first embodiment. In this case, it is possible to reduce the distortion of a signal in high-power operation, as in the first embodiment.

Each of the semiconductor layers in the above described first to third embodiments may be constituted by a plurality of layers satisfying the above described conditions with respect to the electron affinity and the forbidden bandgap. In this case, the plurality of layers constituting each of the semiconductor layers may have different electron affinities or forbidden bandgaps in the range of the above described conditions.

The barrier layers 6 and 57 in the above described first to third embodiments may be composed of semiconductor layers of the same conductivity type as that of the high-power drift layers 5 and 56 as in the above described embodiment, or undoped semiconductor layers.

The forbidden bandgaps of the second low-noise drift layers 4 and 54 in the above described first to third embodiments may be changed in a continuously linear or curved shape, or changed in the other shapes such as a stepped shape.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A field effect semiconductor device comprising:

an undoped first semiconductor layer;

an undoped second semiconductor layer formed on said first semiconductor layer;

a third semiconductor layer of one conductivity type formed on said second semiconductor layer;

a fourth semiconductor layer of said one conductivity type or undoped formed on said third semiconductor layer, said second semiconductor layer having an electron affinity which is greater than that of said first semiconductor layer on its surface on the side of the first semiconductor layer and is equal to or greater than that of said third semiconductor layer on its surface on the side of the third semiconductor layer, and said fourth semiconductor layer having an electron affinity which is equal to or smaller than that of said third semiconductor layer on its surface on the side of the third semiconductor layer; and a fifth semiconductor layer of said one conductivity type or undoped formed in said third semiconductor layer or between the third semiconductor layer and said fourth semiconductor layer, having a greater electron affinity than that of the third semiconductor layer, and having a smaller forbidden bandgap than that of the third semiconductor layer.

2. The field effect semiconductor device according to claim 1, wherein said first semiconductor layer is a buffer layer, said second semiconductor layer is a first channel layer in which electrons mainly drift in low-noise operation, said third semiconductor layer is a carrier-supplying and second channel layer in which electrons mainly drift in high-power operation, said fourth semiconductor layer is a barrier layer, and said fifth semiconductor layer is a third channel layer in which electrons mainly drift in high-power operation.

3. The field effect semiconductor device according to claim 1, wherein said second semiconductor layer comprises a first low-noise drift layer formed on said first semiconductor layer and having a greater electron affinity than that of the first semiconductor layer, and a second low-noise drift layer formed on said first low-noise drift layer, having a forbidden bandgap which is increased in a graded manner from said first low-noise drift layer toward said third semiconductor layer, and having an electron affinity which is equal to or smaller than that of said first low-noise drift layer on its surface on the side of the first low-noise drift layer and is equal to or greater than that of said third semiconductor layer on its surface on the side of the third semiconductor layer.

4. The field effect semiconductor device according to claim 2, wherein said second semiconductor layer comprises a low-noise drift layer formed on said first semiconductor layer, having a forbidden bandgap which is increased in a graded manner from said first semiconductor layer toward said third semiconductor layer, and having an electron affinity which is greater than that of said first semiconductor layer on its surface on the side of the first semiconductor layer and is equal to or greater than that of said third semiconductor layer on its surface on the side of the third semiconductor layer.

5. The field effect semiconductor device according to claim 1, wherein
said fifth semiconductor layer has a thickness of approximately 40 to 100 Å.

6. The field effect semiconductor device according to claim 1, wherein
each of said first to fifth semiconductor layers is constituted by one or a plurality of layers.

7. The field effect semiconductor device according to claim 1, wherein
said first semiconductor layer is composed of a GaAs system, said second semiconductor layer is composed of an InGaAs system, said third semiconductor layer is composed of a GaAs system, said fourth semiconductor layer is composed of an AlGaAs system, and said fifth semiconductor layer is composed of an InGaAs system.

8. The field effect semiconductor device according to claim 1, wherein
said first semiconductor layer is composed of a double-layered structure of an InAlAs system and an InGaAs system, said second semiconductor layer is composed of an InGaAs system, said third semiconductor layer is composed of an InGaAs system, said fourth semiconductor layer is composed of an InAlAs system, and said fifth semiconductor layer is composed of an InGaAs system.

9. The field effect semiconductor device according to claim 1, wherein
said second semiconductor layer is a channel layer in which electrons mainly drift in low-noise operation, and
said third and fifth semiconductor layers are channel layers in which electrons mainly drift in high-power operation.

10. A field effect semiconductor device comprising:
an undoped first semiconductor layer;
an undoped second semiconductor layer formed on said first semiconductor layer;
a third semiconductor layer of one conductivity type formed on said second semiconductor layer;
a fourth semiconductor layer of said one conductivity type or undoped formed on said third semiconductor layer,
said second semiconductor layer having an electron affinity which is greater than that of said first semiconductor layer on its surface on the side of the first semiconductor layer and is equal to or greater than that of said third semiconductor layer on its surface on the side of the third semiconductor layer, and said fourth semiconductor layer having an electron affinity which is equal to or smaller than that of said third semiconductor layer on its surface on the side of the third semiconductor layer;
an undoped fifth semiconductor layer formed between said second semiconductor layer and said third semiconductor layer and having an electron affinity approximately equal to that of said third semiconductor layer;
first and second high conductive regions formed spaced apart from each other in a portion from said fourth semiconductor layer to at least said third semiconductor layer;
first and second ohmic electrodes respectively formed on said first and second high conductive regions; and
a Schottky electrode formed on a region between said first and second high conductive regions.

11. The field effect semiconductor device according to claim 10, wherein
said first semiconductor layer is a buffer layer,
said second semiconductor layer is a first channel layer in which electrons mainly drift in low-noise operation,
said third semiconductor layer is a carrier-supplying and second channel layer in which electrons mainly drift in high-power operation,
said fourth semiconductor layer is a barrier layer, and
said fifth semiconductor layer is an impurity diffusion preventing layer.

12. The field effect semiconductor device according to claim 10, wherein
said first semiconductor layer is a buffer layer,
said second semiconductor layer is a first channel layer in which electrons mainly drift in low-noise operation,
said third semiconductor layer is a carrier-supplying and second channel layer in which electrons mainly drift in high-power operation,
said fourth semiconductor layer comprises a barrier layer having an electron affinity which is equal to or smaller than that of said third semiconductor layer on its surface on the side of the third semiconductor layer and a protective layer having an electron affinity which is equal to or greater than that of said barrier layer on its surface on the side of the barrier layer, and
said fifth semiconductor layer is an impurity diffusion preventing layer.

13. The field effect semiconductor device according to claim 10, wherein
said second semiconductor layer comprises
a first low-noise drift layer formed on said first semiconductor layer and having a greater electron affinity than that of the first semiconductor layer, and
a second low-noise drift layer formed on said first low-noise drift layer, having a forbidden bandgap which is increased in a graded manner from said first low-noise drift layer toward said third semiconductor layer, and having an electron affinity which is equal to or smaller than that of said first low-noise drift layer on its surface on the side of the first low-noise drift layer and is equal to or greater than that of said third semiconductor layer on its surface on the side of the third semiconductor layer.

14. The field effect semiconductor device according to claim 10, wherein
said second semiconductor layer comprises
a low-noise drift layer formed on said first semiconductor layer, having a forbidden bandgap which is increased in a graded manner from said first semiconductor layer toward said third semiconductor layer, and having an electron affinity which is greater than that of said first semiconductor layer on its surface on the side of the first semiconductor layer and is equal to or greater than that of said third semiconductor layer on its surface on the side of the third semiconductor layer.

15. The field effect semiconductor device according to claim 10, wherein
said fifth semiconductor layer has a thickness of approximately 50 to 150 Å.

16. The field effect semiconductor device according to claim 10, wherein each of said first to fifth semiconductor layers is constituted by one or a plurality of layers.

17. The field effect semiconductor device according to claim 11, wherein said buffer layer is composed of a GaAs system, said first channel layer is composed of an InGaAs system, said carrier-supplying and second channel layer is composed of a GaAs system, said barrier layer is composed of an AlGaAs system, and said impurity diffusion preventing layer is composed of a GaAs system.

18. The field effect semiconductor device according to claim 11, wherein said buffer layer is composed of a double-layered structure of an InAlAs system and an InGaAs system, said first channel layer is composed of an InGaAs system, said carrier-supplying and second channel layer is composed of an InGaAs system, said barrier layer is composed of an InAlAs system, and said impurity diffusion preventing layer is composed of an InGaAs system.

19. The field effect semiconductor device according to claim 10, further comprising a sixth semiconductor layer of said one conductivity type or undoped formed in said third semiconductor layer or between the third semiconductor layer and said fourth semiconductor layer, having a greater electron affinity than that of the third semiconductor layer, and having a smaller forbidden bandgap, than that of the third semiconductor layer.

20. A method of fabricating a field effect semiconductor device, comprising the steps of:

forming an undoped buffer layer on a semi-insulating semiconductor substrate;

forming on said buffer layer an undoped first channel layer having an electron affinity which is greater than that of said buffer layer on its surface on the side of the buffer layer;

forming on said first channel layer an undoped impurity diffusion preventing layer having an electron affinity which is equal to or smaller than that of said first channel layer on its surface on the side of the first channel layer;

forming on said impurity diffusion preventing layer a carrier-supplying and second channel layer of one conductivity type having an electron affinity approximately equal to that of said impurity diffusion preventing layer;

forming on said carrier-supplying and second channel layer a barrier layer or a barrier and protective layer of said one conductivity type or undoped having an electron affinity which is equal to or smaller than that of said carrier-supplying and second channel layer on its surface on the side of the carrier-supplying and second channel layer;

forming first and second high conductive regions spaced apart from each other in a portion from said barrier layer or said barrier and protective layer to at least said carrier-supplying and second channel layer by ion implantation and heat treatment; and respectively forming first and second ohmic electrodes on said first and second high conductive regions and forming a Schottky electrode on a region between said first and second high conductive regions.

21. A field effect semiconductor device comprising:

a first channel layer comprising an undoped semiconductor in which electrons mainly drift in low-noise operation; and a second channel layer comprising a semiconductor of one conductivity type in which electrons mainly drift in high-power operation, at least one semiconductor layer of said one conductivity type or undoped having a greater electron affinity than that of said second channel layer and having a smaller forbidden bandgap than that of said second channel layer being provided in the second channel layer or on the second channel layer on the opposite side of said first channel layer.

22. The field effect semiconductor device according to claim 21, wherein said at least one semiconductor layer is a channel layer in which electrons mainly drift in high-power operation.

23. A field effect semiconductor device comprising:

a first channel layer comprising an undoped semiconductor in which electrons mainly drift in low-noise operation;

a second channel layer comprising a semiconductor of one conductivity type in which electrons mainly drift in high-power operation; and an undoped impurity diffusion preventing layer formed between said first channel layer and said second channel layer and having an electron affinity approximately equal to that of said second channel layer.

* * * * *